United States Patent
Grimm

(10) Patent No.: US 7,298,139 B2
(45) Date of Patent: Nov. 20, 2007

(54) SYSTEMS AND METHODS FOR MEASURING MAGNETOSTRICTION IN MAGNETORESISTIVE ELEMENTS

(75) Inventor: Hubert Grimm, Mommenheim (DE)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 10/539,471

(22) PCT Filed: Oct. 17, 2003

(86) PCT No.: PCT/EP03/11512

§ 371 (c)(1),
(2), (4) Date: Jan. 20, 2006

(87) PCT Pub. No.: WO2004/057359

PCT Pub. Date: Jul. 8, 2004

(65) Prior Publication Data

US 2006/0132121 A1    Jun. 22, 2006

(30) Foreign Application Priority Data

Dec. 20, 2002   (EP) .................................. 02102858

(51) Int. Cl.
*G01N 27/72*   (2006.01)
*G01B 7/24*    (2006.01)
*G01R 33/18*   (2006.01)

(52) U.S. Cl. ...................................... 324/232; 324/209

(58) Field of Classification Search ................ 324/202, 324/209, 210, 212, 228, 232, 252; 73/1.15, 73/779, 839, 862.292, 862.69
See application file for complete search history.

(56) References Cited

U.S. PATENT DOCUMENTS

| | | | | |
|---|---|---|---|---|
| 3,336,154 A | * | 8/1967 | Oberg et al. | 427/8 |
| 4,310,798 A | * | 1/1982 | Brunsch et al. | 324/209 |
| 5,721,488 A | * | 2/1998 | Sakai et al. | 324/210 |
| 6,664,783 B1 | * | 12/2003 | Baril et al. | 324/209 |

OTHER PUBLICATIONS

M. Ali, R. Watts, "Measurement of Saturation Magnetostriction Using Novel Strained Substrate Techniques And The Control of the Magnetic Anisotropy," Journal of Magnetism and Magnetic Materials 202(1999) 85-94.
Lydia Baril, Bruce Gurney, Dennis Wilhoit, and V. Speriosu, "Magnetostriction in Spin Valves," Journal of Applied Physics, vol. 85, No. 8, Apr. 15, 1999.
IBM Technical Disclosure Bulletin, "Magnetostriction Mapping of Soft Magnetic Films on Thick Rigid Substrates," vol. 33, No. 8, Jan. 1991.

* cited by examiner

*Primary Examiner*—Edward Lefkowitz
*Assistant Examiner*—Kenneth J Whittington
(74) *Attorney, Agent, or Firm*—Zilka-Kotab, PC

(57) ABSTRACT

A system for directly measuring a magnetostriction value of a magnetoresistive element includes a fixture for receiving a substrate carrying one or more magnetoresistive elements. A magnet assembly applies a first magnetic field parallel to the substrate, and a magnetic alternating field perpendicular to the substrate and parallel to magnetoresistive layers of the elements. A stress-inducing mechanism applies a mechanical stress to the substrate, the stress being oriented parallel to the substrate. A measuring subsystem measures a signal from at least one of the magnetoresistive elements.

25 Claims, 2 Drawing Sheets

SYSTEMS AND METHODS FOR MEASURING MAGNETOSTRICTION IN MAGNETORESISTIVE ELEMENTS

FIELD OF THE INVENTION

The present invention relates in general to the measurement of the magnetostriction constant. More specifically, the invention relates to such measurements in magnetoresistive devices.

BACKGROUND OF THE INVENTION

There are many situations in which there is a need to measure a magnetic field. Among such situations are the measurement of position or proximity of a magnetized portion of a structure, the reactant of stored magnetic information, the measurement of current flows without the need of a measuring device in the current flow path, etc.

Many of the magnetic effects in such situations are relatively small and therefore require a sensitive magnetic sensor. A magnetic sensor capable of sensing such small magnetic field perturbations, and which is economical to fabricate, is provided on the basis of the magnetoresistive effect. Such magnetoresistive material based magnetic sensors can be fabricated as thin films when using monolithic integrated circuit fabrication techniques, and so can not only be made economically but also made quite small in size. A magnetoresistive material based magnetic sensor is arranged by providing a magnetoresistive material to be used as an electrical resistor. A current is passed therethrough, and the voltage there across will depend on the effective resistance of the material over the path in which the current flows. That resistance value will depend in turn on the state of the magnetization of the material. If the magnetization is parallel to the current flow, what is the case for Anisotropic Magnetoresistance (AMR), the material will exhibit a maximum resistance, and it will exhibit a minimum resistance for magnetization perpendicular to the current flow.

For Giant Magnetoresistance (GMR), the maximum resistance is for parallel alignment of the magnetization of adjacent magnetic layers, separated by non-magnetic interface layers. A spin valve system consists of two magnetic layers, a free layer and a pinned layer. The pinning can be made by an antiferromagnetic layer or by antiferromagnetically coupled pinning layers.

The current in such systems can be current-in-plane (CIP) or current-perpendicular-to-plane (CPP). The CPP structure is normally used in tunneling devices (Tunneling Magnetoresistance—TMR), where the non-magnetic interface layer consists of an electrically resistive isolator material.

In the magnetoresistive device there is typically a free rotating layer with an effective magnetization. An external field acting on the magnetoresistive material will rotate the magnetization direction therein to change the resistance of the layer system as a result. The changed resistance of the material carrying the current causes a voltage drop change across the resistor which can be sensed as an indication of the magnitude of the external field.

The effective resistance of such a film will vary as the square of the cosine of the angle between the effective magnetization direction and the current flow direction through the material in the AMR case and as the cosine of the angle of adjacent layers in the GMR or TMR case. The total resistance, however, is usually not of interest but rather the change in resistance in response to a change in the applied external magnetic field. In the AMR case, this change is often best measured at a point along the squared cosine response curve where the curve approximates a linear function.

To provide operation on such a linear portion of the response curve requires that there be an initial angle between the direction of current flow and the nominal direction of magnetization in the absence of any externally applied fields. This can be accomplished in alternative ways in a bias arrangement. The magnetoresistive material can be placed on the device substrate as a continuous resistor in a "herringbone" pattern or other design of continuously connected multiple inclines, with the angle of incline being approximately 45° with respect to the direction of extension of the resistor. There then must be provided a source for a magnetic bias field which is oriented in a direction which is 90° to the direction of the extension of the resistor.

Another method is to provide a linear strip of magnetoresistive material, with additional individual conductors across that strip at an angle of 45° with respect to the direction of the strip. This, in effect, causes the current to flow at an angle through the magnetoresistive strip with respect to the direction of elongation of the strip itself. This latter configuration is often called a "barber pole" sensor because of its configuration, and such an arrangement can eliminate the need for an external source of a magnetic bias field.

In magnetic recording heads the magnetization of the sensing layer of an AMR sensor is rotated by 45° in relation to the sense current by the stray field of an adjacent magnetic layer magnetized perpendicular to the direction of the sensor strip. This layer can be a hard magnetic material (hard bias layer) or a soft magnetic material (soft adjacent layer) magnetized by the sense current.

In GMR or TMR elements the magnetization of the free layer has to be directed parallel to the strip direction. This is normally done by a hard bias layer placed on each side of the sensor. The magnetization of the pinned layers will be fixed perpendicular to the strip direction by antiferromagnetic coupling.

Magnetostriction is an essential parameter for controlling the magnetic properties of thin films and multilayers. Magnetostriction describes the change in length of a magnetic material by magnetic reversal.

In magnetic recording elements it is important to have homogeneously magnetized magnetic layers, especially the sensing layer (free layer) in the sensing layer stack. Inhomogeneously magnetized regions, like vortices or magnetic domains, cause instabilities in the recording signal. Therefore, the magnetic layers are aligned by local magnetic fields (exchange coupling field, hard bias field). Local inhomogeneities can be caused by magnetostrictive anisotropy. Therefore, the magnetostriction has to be controlled very precisely.

Various experimental methods have been developed for investigating the magnetoelastic properties of thin films. One of them is the direct measurement by the so-called "cantilever method". A change in magnetization leads to a change in length which with thin films causes bending of the substrate. This is, e.g., described in E. du Trémolet de Lacheisserie et al., "Magnetostriction and internal stresses in thin films: the cantilever method revisited", Journal of Magnetism and Magnetic Materials 136 (1994), pp. 189-196.

Another possibility is the indirect measurement by means of the strain gauge method, which creates mechanical stresses in a magnetic film. The magnetic anisotropy changes through magnetostrictive coupling. This is, e.g., described in D. Markham et al., "Magnetostrictive measurement of magnetostriction in Permalloy", IEEE Transactions on Magnetics, vol. 25, no. 5, September 1989, pp. 4198-4200.

An apparatus for measuring the magnetostriction constant of a magnetic membrane is disclosed in Patent Abstracts of Japan, JP 62106382 A2.

Kenji Narita et al., IEEE Transactions on Magnetics, vol. Mag-16, no. 2, March 1980, pp. 435-439, disclose a method to measure the saturation magnetostriction of a thin amorphous ribbon by means of Small-Angle Magnetization Rotation (SAMR).

However, no method is known to measure the magnetization changes using the magnetoresistive effect of magnetic sensors directly, so that the real environment of the sensor is reflected. Therefore, there is still a need for improvement of such methods.

SUMMARY OF THE INVENTION

A system for directly measuring a magnetostriction value of a magnetoresistive element, such as a magnetostriction constant, includes a fixture for receiving a substrate carrying one or more magnetoresistive elements. A magnet assembly applies a first magnetic field, preferably a DC field, parallel to the substrate. The magnet assembly also applies a magnetic alternating field perpendicular to the substrate and parallel to magnetoresistive layers of the elements. A mechanism for applying a mechanical stress to the substrate creates a stress oriented parallel to the substrate. A measuring subsystem, which may be locked to the frequency of the alternating field, measures a signal from at least one of the magnetoresistive elements.

The system may further include a controller for changing the first magnetic field, and a computing device for calculating a magnetostriction constant of the at least one magnetoresistive element based in part on e.g., a change of mechanical stress anisotropy due to application of the mechanical stress and the change in the first magnetic field.

The substrate can be a row or a wafer, which may in turn carry a plurality of the magnetoresistive elements such as Anisotropic Magnetoresistance (AMR)-, Giant Magnetoresistance (GMR)- or Tunneling Magnetoresistance (TMR)-based sensors, and may further include shielding layers, etc. The magnetoresistive elements may also be magnetic memory elements.

The signal from the at least one of the magnetoresistive elements is measured before the mechanical stress is applied. After applying the mechanical stress, the first magnetic field is changed until the signal being measured co-currently thereto about matches the signal measured before applying the mechanical stress.

The mechanism for applying the mechanical stress may cause the substrate to bend. An illustrative mechanism is an electronically or manually controlled micrometer screw. Alternatively, the mechanism for applying the mechanical stress may be a heat source, a heat sink, or a piezo layer.

Methods for directly measuring a magnetostriction value of a magnetoresistive element are also disclosed.

Other aspects of the present invention will become apparent from the following detailed description, which, when taken in conjunction with the drawings, illustrate by way of example the principles of the invention

DETAILED DESCRIPTION OF THE PREFERRED EMBODIMENT

In the present invention, the magnetostriction constant (MS) in Anisotropic Magnetoresistance (AMR), Giant Magnetoresistance (GMR) and/or Tunneling Magnetoresistance (TMR) (in general XMR) based elements, like magnetic recording heads, magnetic field sensors and the like, is measured by small angle magnetization rotation (SAMR). The electrical signal of the sensor is used to measure the magnetization rotation caused by an external field. In Magnetoresistance (MR) devices, the magnetization is biased by various methods, e.g., hard bias, antiferromagnetic exchange coupling, barber pole, etc. For the proposed Ms measurement the bias fields (hard bias, soft bias, exchange field) can be supported by an additional external DC field (HDC) which is aligned parallel to the applied stress. If the stress in the thin film is changed, the sensor signal will also change due to magnetostrictive coupling. However, the change of the sensor signal can be compensated by changing the external DC field. For shielded elements the external field is calibrated in order to reflect the influence of demagnetizing effects from the shielding layers. The stress can be applied on wafer or row level by bending or by any other means like, e.g., temperature change induced by heat source or heat sink, piezo layer, etc.

The methodology according to the invention is not only applicable to magnetic recording heads but can also be used with other magnetic devices such as magnetic field sensors and magnetic random access memories (MRAMs). However, for the sake of simplicity, it is explained in the following description with respect to magnetic recording heads.

Figure 1:
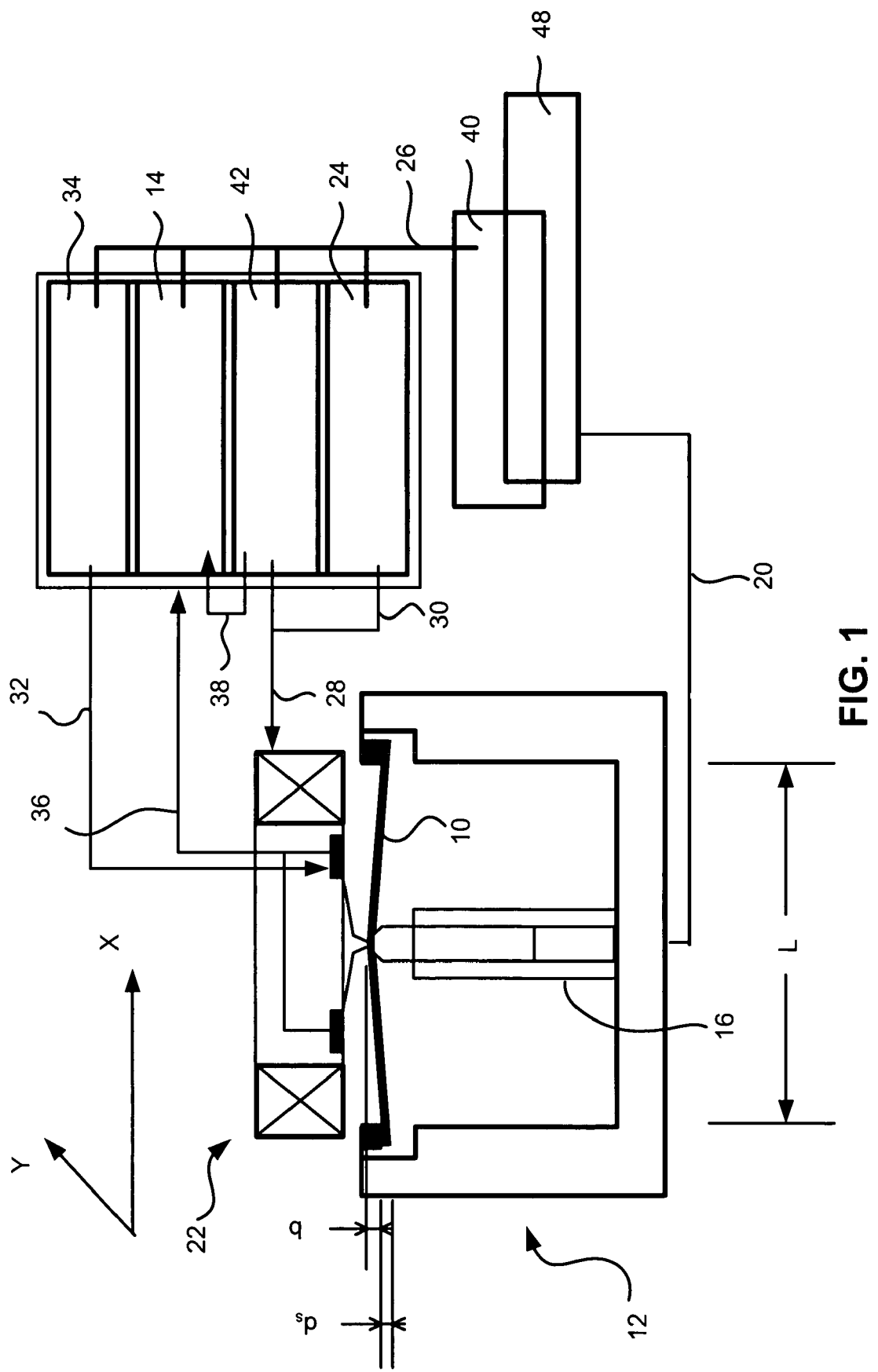
FIG. 1 schematically depicts a system for measuring the magnetostriction constant according to a preferred method of the present invention.

FIG. 1 schematically depicts a system for measuring the magnetostriction constant according to the methodology of the present invention. As shown, a row or a wafer 10 is inserted into a bending fixture, e.g., a deflection gauge 12, the row or wafer carrying XMR elements formed thereon. Next, a first magnetic field, preferably a DC-field, is applied parallel to the row or wafer 10, i.e., in the direction of the x-axis shown in FIG. 1. A magnetic alternating field is applied perpendicular to the row or wafer 10 and parallel to the magnetoresistive layers, i.e., in the direction of the y-axis shown in the Figure. This alternating field is preferably sinusoidal having the frequency f. A measuring subsystem 14 measures a signal at the magnetoresistive element, e.g., XMR element, this signal being proportional to the amplitude of the alternating field having the frequency f. To do this in a simple way, a lock-in amplifier 14 can be used which is locked to the frequency of the alternating field. A mechanical stress is created in the layers of the XMR element parallel to the x-direction by bending the row or wafer 10, e.g., by means of a micrometer screw 16, pneumatically or hydraulically actuated piston, solenoid, etc. The screw or other stress-inducing mechanism can be controlled electronically via line 20 by a control unit 48. Due to the magnetoelastic interaction in the sensor layer of the XMR element, the magnetic anisotropy will change. This, in turn, will lead to a change in the amplitude of the signal that is measured at the lock-in amplifier 14. Finally, the applied magnetic DC-field in the direction of the x-axis is changed by a suitable control circuit until the measuring signal at the lock-in amplifier again reaches the value that has been measured without having applied mechanical stress. The magnet assembly 22 above the row/wafer deflection fixture 12 is powered by an AC power supply 42 for magnetic field generation in the y-direction, and a DC power supply 24 for generating the DC compensation field in the x-direction via lines 28 and 30. The XMR– element is powered via line 32 by a constant current source 34. The sense output, the voltage across the XMR– resistor, is fed via line 36 into the lock-in amplifier 14, being locked to the excitation frequency of the magnetic AC field via line 38, as already mentioned above. The whole measurement assembly can be controlled by a computer 40 via bus 26. Note also that the computer 40 itself can perform some or all of the functions of, and/or replace, the various components 34, 14, 42, 24, 48 in hardware, software, or combinations thereof.

Figure 2:
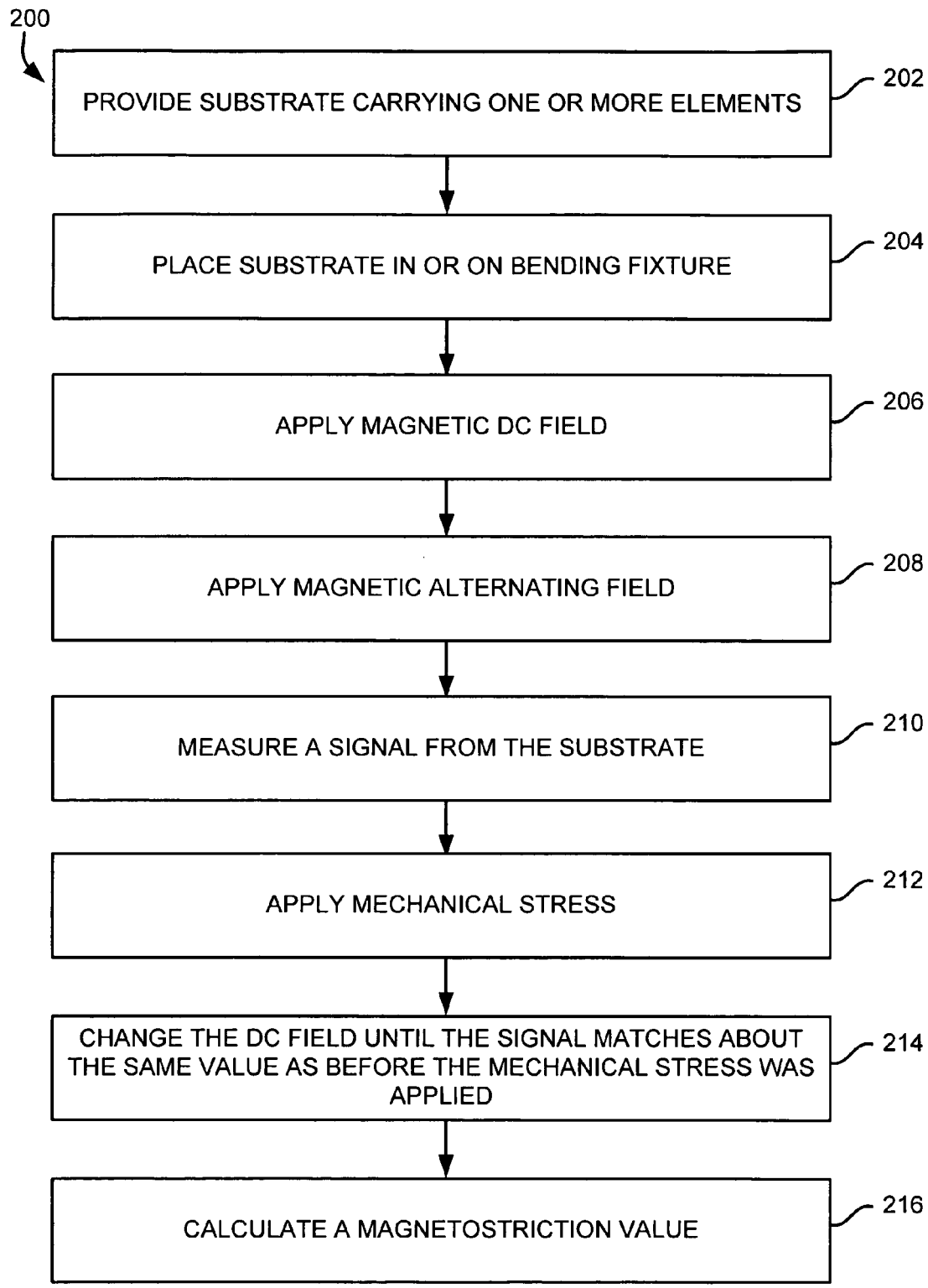
FIG. 2 is a flow diagram of a process for measuring the magnetostriction constant according to one embodiment of the present invention.

FIG. 2 graphically illustrates a method 200 for directly measuring the magnetostriction constant of a magnetoresistive element according to preferred embodiment. In operation 202, a substrate carrying one or more magnetoresistive elements is provided. The substrate is inserted into or onto a bending fixture in operation 204. In operation 206, a magnetic DC field is applied parallel to the substrate, while in operation 208, a magnetic alternating field is applied perpendicular to the substrate and parallel to the magnetoresistive layers of the elements. A signal from the element is measured in operation 210. A mechanical stress oriented parallel to the substrate is applied in operation 212 by bending the substrate. In operation 214, the magnetic DC field is changed until the current signal reading about matches the signal measured before applying the mechanical stress. In operation 216, the magnetostriction constant $\lambda_s$ (or other value) is calculated. Illustrative formulae for calculating the magnetostriction constant and other values are presented below.

The magnetostriction $\lambda_s$ is defined by the following formula $$\frac{3}{2}\lambda_s * \Delta\sigma = \frac{1}{2}\Delta H_{k,\sigma} M_s \qquad (I)$$

that indicates that the magnetoelastic energy density (left side of the equation) is identical to the magnetic anisotropic energy density (right side of the equation).

The change of mechanical stress anisotropy $\Delta\sigma$ is connected with the strain change $$\Delta\varepsilon = \frac{\Delta l}{l}$$

(the relative elongation caused by bending of the row or wafer), by Hooke's law (being restricted to homogeneous and isotropic materials).

$$\Delta\sigma_x = \frac{E}{1-v^2}(\Delta\varepsilon_x - v\Delta\varepsilon_y); \Delta\sigma_y = \frac{E}{1-v^2}(\Delta\varepsilon_y - v\Delta\varepsilon_x)$$

The voltage change $\Delta\sigma$ is calculated from the mechanical parameters of the deflection:

$$\Delta\sigma = \Delta\sigma_x - \Delta\sigma_y = \frac{E}{1-v}(\Delta\varepsilon_x - \Delta\varepsilon_y) \qquad (II)$$

The following methods can be used to obtain special mechanical parameters:
1) The strain can be calculated from the deflection (b in FIG. 1) by the following expression:

$$\Delta\varepsilon_x = \frac{3d_s * b}{2L^2}\left[1 - \frac{|x|}{L}\right], \qquad (III)$$

where L is the bending length (cf. FIG. 1), $d_s$ is the substrate thickness (cf. FIG. 1), x=0 at the center of the strain gauge, and $\Delta\varepsilon_y$=0.
2) Measuring the surface curvature by scanning a laser beam over the sample surface. The laser is reflected from the row or wafer surfaces to a position sensitive optical device.

The strain $\Delta\varepsilon$ is determined from the deflection b or the surface curvature in (II).

The measurement of the field of anisotropy follows from the total energy:

$$E = H_x M_s \cos\vartheta - H_y M_s \sin\vartheta + \frac{1}{2}H_k M_s \sin^2\vartheta + \frac{1}{2}\langle N_{demag}\rangle M_s^2 \sin^2\vartheta \qquad (IV)$$

This term includes the energy in the external fields ($H_x$, $H_y$), the uniaxial anisotropy ($H_k$), which is composed of the induced anisotropy and the magnetostrictive anisotropy, as well as the form anisotropy, which takes into account the distribution of the magnetization of the layer to be measured.

From the condition of equilibrium dE/d=0 follows:

$$\sin\vartheta = \frac{H_y}{H_x + H_k + \langle N_{demag}\rangle M_s}. \qquad (V)$$

Given a periodic excitation field $H_y$=$H_{yo}$ sin ($\Phi$t), the magnetization will fluctuate around a state of equilibrium. The resistance of a magnetoresistive element changes with the identical frequency.

A mechanical tension changes the anisotropic field $H_k$. This, in turn, causes a change in resistance and a change in amplitude of the fluctuations of the magnetization. These changes are compensated by means of the external field $H_x$ and the original state of equilibrium is restored. The following equation applies:

$$\Delta H_{k,\sigma} = \Delta H_x \qquad (VI).$$

The calculation of $\lambda_s$ is straight forward. The strain $\Delta\varepsilon$ can be calculated, e.g., from (III). The stress anisotropy $\Delta\sigma$ is then derived from (II). From (I) the magnetostriction constant can be calculated by inserting $\Delta\sigma$, and $\Delta H_{k,\sigma}$ from (IV).

The saturation magnetization $M_s$ and the elasticity constants E and v are inserted into equation (I) as constants.

One skilled in the art will appreciate that calculations using the foregoing equations can be performed in hardware or software, such as by the computer 40 in FIG. 1. The calculation details and results can then be stored or transmitted in electronic form, tabulated for multiple elements on the substrate and/or for elements across various substrates, displayed in visual form, output on paper, etc.

Also, as an alternative, the first magnetic field can be a static field from a hard magnet. To vary the field, the distance between the magnet and the substrate can be varied.

The present invention suggests using the MR-effect of the magnetic sensors directly for the measurement of the magnetization changes. The methodology according to the present invention has the following advantages, among others:

The use of a compensation method guarantees a fixed magnetization state, which avoids errors by local magnetization distributions in structured films. Bias fields, e.g., softbias in anisotropic magnetoresistive sensor (AMR), longitudinal magnetically hard fields (hardbias) or exchange fields adjacent magnetic layers do not have any effect.

The measurement is simple and fast.

The MR effect is very sensitive.

The measurement can be performed in the sensor elements themselves. There is no need to have separately-manufactured monitor layers.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system for directly measuring a magnetostriction value of a magnetoresistive element, the system comprising:
   a fixture for receiving a substrate carrying one or more magnetoresistive elements;
   a magnet assembly for applying a first magnetic field parallel to the substrate, and for applying a magnetic alternating field perpendicular to the substrate and parallel to magnetoresistive layers of the elements;
   a mechanism for applying a mechanical stress to the substrate, the stress being oriented parallel to the substrate; and
   a measuring subsystem for measuring a signal from at least one of the magnetoresistive elements.

2. A system according to claim 1, wherein the substrate is a row or a wafer.

3. A system according to claim 2, wherein the row or wafer carries a plurality of the magnetoresistive elements.

4. A system according to claim 1, wherein the first magnetic field is a DC field.

5. A system according to claim 1, wherein the measuring subsystem is locked to a frequency of the alternating field.

6. A system according to claim 1, wherein the signal from the at least one of the magnetoresistive elements is measured before the mechanical stress is applied; wherein, after applying the mechanical stress, the first magnetic field is changed until the signal being measured co-currently thereto about matches the signal measured before applying the mechanical stress.

7. A system according to claim 1, wherein the mechanism for applying the mechanical stress causes the substrate to bend.

8. A system according to claim 7, wherein the mechanism for applying the mechanical stress is a micrometer screw.

9. A system according to claim 8, wherein the micrometer screw is electronically controlled.

10. A system according to claim 1, wherein the mechanism for applying the mechanical stress is a heat source.

11. A system according to claim 1, wherein the mechanism for applying the mechanical stress is a piezo layer.

12. A system according to claim 1, further comprising a controller for changing the first magnetic field.

13. A system according to claim 12, further comprising a computing device for calculating a magnetostriction constant of the at least one magnetoresistive element based in part on a change of mechanical stress anisotropy due to application of the mechanical stress and the change in the first magnetic field.

14. A system according to claim 1, wherein the at least one magnetoresistive element includes shielding layers, wherein the first magnetic field is calibrated to reflect an influence of a demagnetizing effect of the shielding layers on the element.

15. A system according to claim 1, wherein the magnetoresistive element is an Anisotropic Magnetoresistance (AMR)-, Giant Magnetoresistance (GMR)- or Tunneling Magnetoresistance (TMR)-based sensor.

16. A system according to claim 1, wherein the magnetoresistive elements are magnetic memory elements.

17. A system for directly measuring a magnetostriction value of a magnetoresistive element, the system comprising:
    a bending fixture for receiving a substrate carrying one or more magnetoresistive elements;
    a magnet assembly for applying a magnetic direct current (DC) field parallel to the substrate, and for applying a magnetic alternating field perpendicular to the substrate and parallel to magnetoresistive layers of the elements;
    a mechanism for applying a mechanical stress to the substrate by bending the substrate, the stress being oriented parallel to the substrate;
    a control circuit for changing the DC magnetic field; and
    a measuring subsystem for measuring a signal from at least one of the magnetoresistive elements prior to application of the mechanical stress, after application of the mechanical stress, and during a time period when the DC magnetic field is changed.

18. A system for directly measuring a magnetostriction value of a magnetoresistive element, the system comprising:
    a bending fixture for receiving a substrate carrying one or more magnetoresistive elements;
    a magnet assembly for applying a magnetic direct current (DC) field parallel to the substrate, and for applying a magnetic alternating field perpendicular to the substrate and parallel to magnetoresistive layers of the elements;
    a DC power supply for providing power to the magnet assembly;
    an alternating current (AC) power supply for providing power to the magnet assembly;
    a mechanism for applying a mechanical stress to the substrate by bending the substrate, the stress being oriented parallel to the substrate;
    a measuring subsystem for measuring a signal from at least one of the magnetoresistive elements prior to application of the mechanical stress, after application of the mechanical stress, and during a time period when the DC magnetic field is changed;
    a control circuit for changing the DC magnetic field until the signal currently being measured by the measuring subsystem about matches a signal measured before applying the mechanical stress; and
    a computing device for calculating a magnetostriction constant of the at least one magnetoresistive element based in part on a change of mechanical stress anisotropy due to application of the mechanical stress and the change in the DC magnetic field.

19. A method for directly measuring a magnetostriction value of a magnetoresistive element, the method comprising:
   providing a substrate carrying one or more magnetoresistive elements;
   placing the substrate on a fixture;
   applying a first magnetic field parallel to the substrate;
   applying a magnetic alternating field perpendicular to the substrate and parallel to magnetoresistive layers of the elements;
   measuring a signal from the element;
   applying a mechanical stress to the substrate, the stress being oriented parallel to the substrate; and
   changing the first magnetic field until the signal currently being measured about matches a signal measured before applying the mechanical stress.

20. A method according to claim 19, wherein the substrate is a row or a wafer.

21. A method according to claim 20, wherein the row or wafer carries a plurality of the magnetoresistive elements.

22. A method according to claim 19, wherein the mechanical stress causes the substrate to bend.

23. A method according to claim 22, wherein the mechanical stress is applied by a micrometer screw.

24. A method according to claim 19, wherein the magnetoresistive element is an Anisotropic Magnetoresistance (AMR)-, Giant Magnetoresistance (GMR)- or Tunneling Magnetoresistance (TMR)-based sensor.

25. A method for directly measuring a magnetostriction value of a magnetoresistive element, the method comprising:
   providing a substrate carrying one or more magnetoresistive elements;
   placing the substrate on a bending fixture;
   applying a magnetic DC field parallel to the substrate;
   applying a magnetic alternating field perpendicular to the substrate and parallel to magnetoresistive layers of the elements;
   measuring a signal from at least one element;
   applying a mechanical stress to the substrate by bending the substrate, the stress being oriented parallel to the substrate;
   changing the magnetic DC field until the signal currently being measured about matches a signal measured before applying the mechanical stress; and
   calculating a magnetostriction value of the element.

* * * * *